(12) United States Patent
Yoshida et al.

(10) Patent No.: US 7,764,014 B2
(45) Date of Patent: *Jul. 27, 2010

(54) ORGANIC EL DISPLAY PANEL WITH BANKS DEFINING LINE-STATE PIXELS

(75) Inventors: Hidehiro Yoshida, Osaka (JP); Yoshiro Kitamura, Osaka (JP); Keisei Yamamuro, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/306,368

(22) PCT Filed: May 21, 2008

(86) PCT No.: PCT/JP2008/001268

§ 371 (c)(1),
(2), (4) Date: Dec. 23, 2008

(87) PCT Pub. No.: WO2008/149499

PCT Pub. Date: Dec. 11, 2008

(65) Prior Publication Data
US 2009/0284135 A1    Nov. 19, 2009

(30) Foreign Application Priority Data
May 30, 2007   (JP) ............................. 2007-143906

(51) Int. Cl.
*H05B 33/00* (2006.01)
*H05B 33/14* (2006.01)

(52) U.S. Cl. ..................... 313/506; 313/504; 445/24; 428/690

(58) Field of Classification Search .......... 313/504–506
See application file for complete search history.

(56) References Cited

U.S. PATENT DOCUMENTS

| 6,281,634 B1 | 8/2001 | Yokoyama |
| 6,366,025 B1 | 4/2002 | Yamada |
| 6,388,377 B1 | 5/2002 | Kobayashi et al. |
| 6,429,599 B1 | 8/2002 | Yokoyama |
| 6,433,486 B1 | 8/2002 | Yokoyama |

(Continued)

FOREIGN PATENT DOCUMENTS

JP         2000-195668 A       7/2000

(Continued)

OTHER PUBLICATIONS

English language Abstract of JP 2003-100466 A.

(Continued)

*Primary Examiner*—Sikha Roy
(74) *Attorney, Agent, or Firm*—Greenblum & Bernstein, P.L.C.

(57) ABSTRACT

An organic EL display panel having a polymer organic EL layer with a uniform thickness is provided. The organic EL display panel includes a substrate, anode electrodes set on the substrate; a hole transport layer provided on the substrate on which the anode electrodes are set; banks provided in lines on the hole transport layer to define line-state pixel regions; an interlayer set in a line in the pixel region; a polymer organic EL layer set in a line on the interlayer in the pixel region; and a cathode electrode provided on the polymer organic EL layer.

14 Claims, 12 Drawing Sheets

U.S. PATENT DOCUMENTS

| | | |
|---|---|---|
| 6,948,993 B2 | 9/2005 | Yi et al. |
| 7,091,660 B2 | 8/2006 | Park et al. |
| 7,477,014 B2 * | 1/2009 | Mitsuya .................... 313/504 |
| 2004/0119066 A1 | 6/2004 | Han et al. |
| 2004/0140759 A1 | 7/2004 | Park et al. |
| 2005/0170208 A1 | 8/2005 | Yatsunami et al. |
| 2006/0284189 A1 | 12/2006 | Sakata et al. |
| 2007/0075618 A1 | 4/2007 | Mitsuya |
| 2008/0012480 A1 | 1/2008 | Yatsunami et al. |
| 2008/0290339 A1 | 11/2008 | Nakatani et al. |
| 2009/0272999 A1 * | 11/2009 | Yoshida et al. ............. 257/98 |

FOREIGN PATENT DOCUMENTS

| | | |
|---|---|---|
| JP | 2003-100466 A | 4/2003 |
| JP | 2004-006362 A | 1/2004 |
| JP | 2004-234901 | 8/2004 |
| JP | 2004-234901 A | 8/2004 |
| JP | 2004-235128 | 8/2004 |
| JP | 2004-235128 A | 8/2004 |
| JP | 2005-235569 | 9/2005 |
| JP | 2005-235569 A | 9/2005 |
| JP | 2005-294204 A | 10/2005 |
| JP | 2006-114477 A | 4/2006 |
| JP | 2006-236819 A | 9/2006 |
| JP | 2007-019489 A | 1/2007 |
| JP | 2007-026976 A | 2/2007 |
| JP | 2007-095521 | 4/2007 |
| JP | 2007-095614 A | 4/2007 |

OTHER PUBLICATIONS

English language Abstract of JP 2006-236819 A.
English language Abstract of JP 2004-006362 A.
English language Abstract of JP 2005-294204 A.
U.S. Appl. No. 11/914,840 to Yoshida et al., which was filed Apr. 23, 2008.

\* cited by examiner

ORGANIC EL DISPLAY PANEL WITH BANKS DEFINING LINE-STATE PIXELS

TECHNICAL FIELD

The present invention relates to an organic EL (OEL) display panel and a manufacturing method thereof.

BACKGROUND ART

An OEL display panel is a display panel that uses light-emitting elements exploiting electro-luminescence of organic compounds. That is, the OEL display panel has a cathode, an anode, and organic compound-containing EL elements for electro-luminescense which are provided between the electrodes. Electro-luminescent organic compounds can be roughly classified into combinations of low-molecular organic compounds (host material and dopant material) and high-molecular organic compounds (polymer organic compounds). Examples of the electro-luminescent polymer organic compounds include polyphenylenevinylene (also referred to as PPV) and its derivatives. The OEL display panel using the electro-luminescent polymer organic compound is driven with a relatively low voltage, consumes less power and is considered to be capable of contributing to display panel size reduction; therefore, active research has been promoted.

Electro-luminescent polymer organic compounds are applied with a printing technique such as ink-jetting to respective pixels according to their color of emitting light (R, G or B). For example, for printing, an ink-jet head is used to discharge polymer inks containing such polymer organic compound and solvent. When an ink containing electro-luminescent polymer organic compound is printed in a certain pixel, it is necessary to prevent intrusion of the polymer ink into adjacent pixels.

In order to prevent intrusion of the polymer ink into the adjacent pixels, the following two methods have been employed.

A first method is to provide banks defining sub pixels in a pixel and drop a polymer ink precisely only to each sub pixel so as to prevent the intrusion of the ink into adjacent pixels.

A second method is to provide banks defining line-state pixels and banks defining sub pixels in each pixel in such a way that the former banks are higher than the latter banks defining the sub pixels, thereby suppressing intrusion of a polymer ink into adjacent pixels when it is applied to the entire region (including regions between adjacent sub pixels) of a pixel (See Patent Documents 1 and 2, for example).

A polymer ink can be readily and rapidly applied to all of the sub pixels by applying it over the entire pixel region at a time with the second method, rather than by applying it on a one-by-one basis with the first method. However, with the second method, the thickness of an organic light-emitting layer is unlikely to be uniform.

Patent Document 1: U.S. Pat. No. 6,388,377

Patent Document 2: U.S. Pat. No. 7,091,660

DISCLOSURE OF THE INVENTION

Problems to be Solved by the Invention

The inventors conducted studies to provide an easier method of manufacturing an OEL display panel which includes the step of making an organic light-emitting layer by applying polymer inks containing an electro-luminescent polymer organic compound to line-state pixel regions, each including a plurality of sub pixels. In the course of the studies, it was found that one cause of non-uniformity in the thickness of an organic light-emitting layer prepared from the applied polymer ink was due to non-uniformity in the thickness of a hole transport layer or interlayer—a layer disposed under the organic light-emitting layer.

The cause of non-uniform thickness of the hole transport layer or interlayer was found to be the manner in which it is prepared: Banks defining pixel regions and banks defining sub pixel regions are formed, and then a hole transport layer or interlayer is formed in regions defined by these banks. That is, it was found that one cause of the above problem was due to the formation of the hole transport layer or interlayer inside banks with complicated structure.

Means for Solving the Problem

The present inventors have found that, without providing a discrete hole transport layer or interlayer for each sub pixel, an OEL display operates normally even when a hole transport layer or interlayer is shared by a plurality of sub pixels.

Accordingly, the inventors conducted studies to obtain an organic EL layer having a uniform thickness in the manner as follows: A hole transport layer or interlayer is formed on a substrate on which anode electrodes are formed; banks defining line-state pixels and, as necessary, banks defining sub pixels in each pixel are formed on the hole transport layer or interlayer; and polymer inks containing an electro-luminescent polymer organic compound are applied over the entire pixel regions.

The inventors conducted further studies to obtain an organic EL layer having a uniform thickness in the manner as follows: banks defining line-state pixels are formed on a substrate on which anode electrodes are formed; a hole transport layer or interlayer is formed on the line-state pixel; banks defining sub pixels in each pixel are formed on the hole transport layer or interlayer; and polymer inks containing an electro-luminescent polymer organic compound are applied over the entire pixel regions.

With these procedures, the hole transport layer or interlayer can be formed by means of so-called "overall coating" over the entire substrate including a plurality of pixels regions or over the entire pixel region including a plurality of sub pixels. In this way, a hole transport layer or interlayer with a uniform thickness can be obtained. As used herein, "overall coating" means coating by such a coating method as spin coating, die coating or slit coating. Since it is possible to produce a hole transport layer or interlayer with a uniform thickness, the thickness of the resultant organic EL layer becomes likely to be uniform.

Specifically, a first aspect of the present invention relates to organic EL display panels mentioned below:

[1] An organic EL display panel including: a substrate; anode electrodes set on the substrate; a hole transport layer provided on a surface of the substrate provided with the anode electrodes; banks set in lines on the hole transport layer to define line-state pixel regions; line-state interlayers set in the pixel regions; line-state organic EL layers set on the interlayers in the pixel regions; and a cathode electrode provided on the polymer organic EL layer.

[2] The organic EL display panel according to [1], wherein the bank contains a fluorine resin, or a surface of the bank is fluorinated by fluorine gas plasma.

[3] The organic EL display panel according to [1] or [2], further including an insulating inorganic film that protrudes from the bank into the pixel region and is in contact with a bottom surface of the interlayer or polymer organic EL layer, wherein a material of the hole transport layer contains tungsten oxide ($WO_x$), molybdenum oxide ($MoO_x$), vanadium oxide ($VO_x$) or a combination thereof.

[4] An organic EL display panel including: a substrate; anode electrodes set on the substrate; line-state banks provided on the substrate to define line-state pixel regions; a line-sate hole transport layer set in the pixel region; a line-state interlayer set in the pixel region; a line-state polymer organic EL layer set on the interlayer in the pixel region; and a cathode electrode provided on the polymer organic EL layer.

[5] The organic EL display panel according to [4], wherein the bank contains a fluorine resin, or a surface of the bank is fluorinated by fluorine gas plasma.

[6] The organic EL display panel according to [4] or [5], further including an insulating inorganic film that protrudes from the bank into the pixel region and is in contact with a bottom surface of the interlayer or polymer organic EL layer, wherein a material of the hole transport layer contains tungsten oxide ($WO_x$), molybdenum oxide ($MoO_x$), vanadium oxide ($VO_x$) or a combination thereof.

[7] The organic EL display panel according to claim 8, further including an insulating inorganic film that protrudes from the bank into the pixel region and is in contact with a bottom surface of the hole transport layer, wherein a material of the hole transport layer contains polyethylenedioxythiophene.

Moreover, a second aspect of the present invention relates to a method of manufacturing the OEL display panel mentioned below:

[8] A manufacturing method of an organic EL display panel including: forming a first conductive layer on a surface of a substrate; forming a hole transport layer on the substrate on which the first conductive layer is formed; forming electrically insulating line-state banks on the hole transport layer so as to define line-state regions to be pixel regions; forming a line-state interlayer in the region to be a pixel region; forming a line-state polymer organic EL layer by coating the region to a pixel region with an ink containing a polymer organic EL material and a solvent by ink-jet, dispensing, nozzle coating, intaglio printing or letterpress printing; and forming a second conductive layer on the organic EL layer.

[9] A manufacturing method of an organic EL display panel including: forming a first conductive layer on a surface of a substrate; forming electrically insulating line-state banks on the substrate on which the first conductive layer is provided so as to define line-state region to be pixel regions; forming a line-state hole transport layer in the region to be a pixel region; forming a line-state interlayer in the regions to be a pixel region; forming a line-state polymer organic EL layer by coating the region to be a pixel region with an ink containing a polymer organic EL material and a solvent by ink-jet, dispensing, nozzle coating, intaglio printing or letterpress printing; and forming a second conductive layer on the organic EL layer.

Effect of the Invention

A polymer organic EL display panel of the present invention includes functional layers (e.g., polymer organic EL layer) having uniform thickness held between the cathode electrode and anode electrode and thus shows improved light-emitting characteristics over conventional display panels. In addition, among such functional layers, since the hole transport layer and interlayer (except for the polymer organic EL layer) held between the cathode electrode and anode electrode are provided by means of so-called "overall coating", a manufacturing process of the polymer organic EL display panel can be simplified.

BEST MODE FOR CARRYING OUT THE INVENTION

Figure 1A:
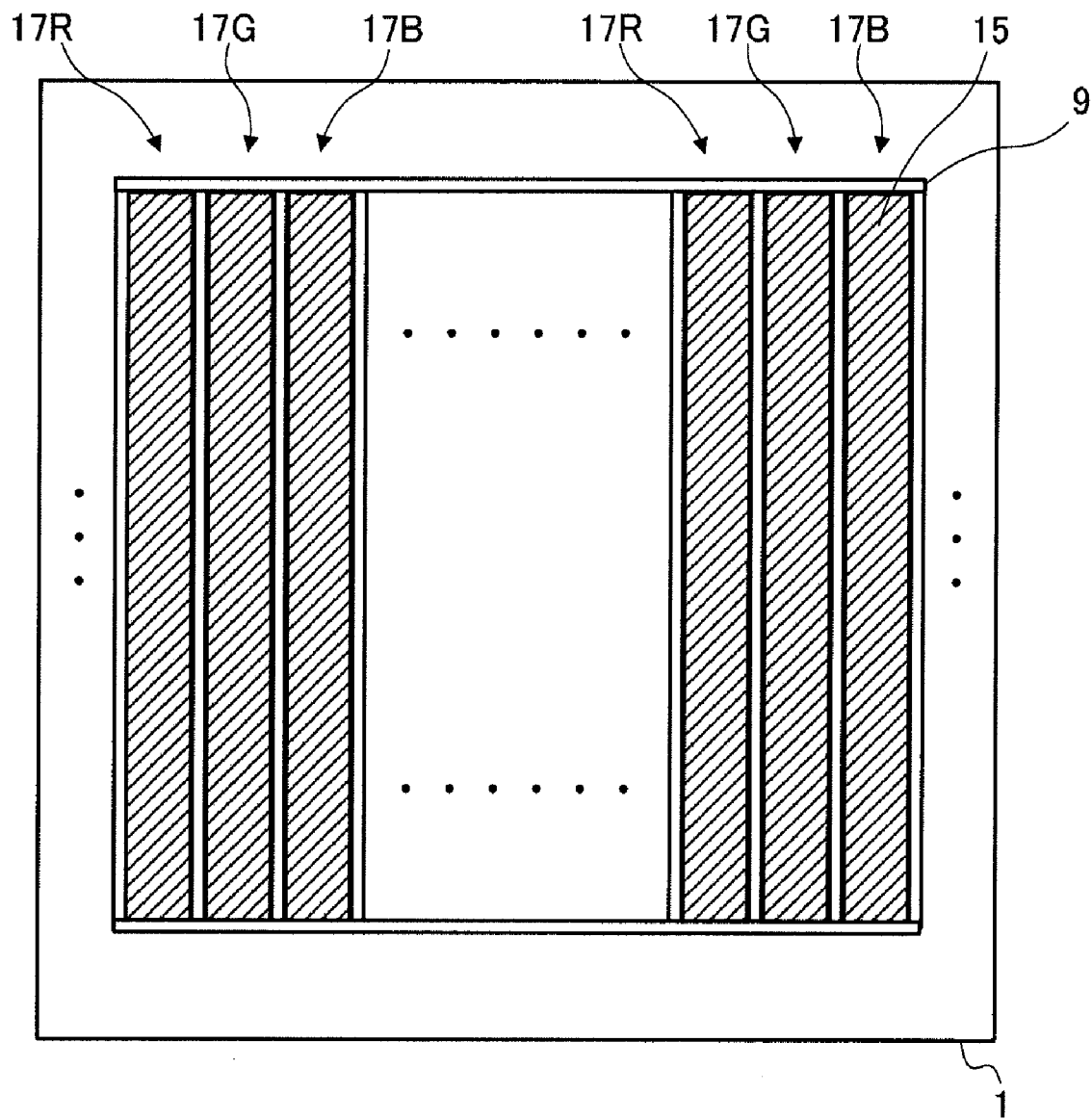
FIG. 1A is a plan view of an organic EL display panel of the present invention.

1. Organic EL display panel of the present invention

An organic EL display panel of the present invention has a substrate, anode electrodes, cathode electrode, and organic EL element having a hole transport layer, interlayer and light-emitting layer, which layers are held between the electrodes. In addition, the organic EL display panel of the present invention has first banks.

The organic EL display panel of the present invention preferably uses a polymer organic EL material for the light-emitting layer. The display panel has thin film transistors (driving TFTs) for driving organic EL elements, and the anode electrode of the organic EL element and a source or drain electrode of the driving TFT are connected to each other.

The organic EL display panel of the present invention is characterized by the structure of the organic EL element, particularly the arrangements of the functional layers; however, the other configurations may be the same as those of known organic EL display panels as long as the effect of the present invention is not impaired.

For example, the organic EL display panel of the present invention may be of passive matrix type in which anode electrodes are arranged lines or active matrix type in which anode electrodes are arranged in matrix form. Furthermore, the organic EL display may be of bottom emission type (where emitted light is taken out through the anode electrodes and substrate) or top emission type (where emitted light is taken out through a cathode electrode or seal film).

The material of the substrate of the organic EL display panel of the present invention changes depending on whether it is of bottom emission type or top emission type. In the case of bottom emission type, since the substrate is required to be transparent, the substrate may be made of glass, transparent resin or the like. On the other hand, in the case of top emission type, there is no need for the substrate to be transparent, and any insulating material can be employed.

The anode electrodes are formed on the substrate. When the organic EL display panel is of passive matrix type, the anode electrodes are arranged in lines. The lines of the anode electrodes preferably run in parallel with each other. When the organic EL display panel is of active matrix type, the anode electrodes are arranged in matrix form on the substrate.

When the organic EL display panel is of bottom emission type, the anode electrodes are required to be transparent electrodes, and therefore, they may be made of ITO or the like. When the organic EL display panel is of top emission type, the anode electrodes are required to have light reflectivity, and therefore, they may be made of an alloy containing silver, more specifically a silver-palladium-copper alloy (also referred to as APC), for example. The anode electrode layer may have a tungsten thin film on its surface.

On the substrate on which the anode electrodes are formed, a hole transport layer or interlayer is formed. It is needless to say that the both layers may be formed as long as the layers are formed in the order of the hole transport layer and the interlayer from the substrate. The hole transport layer may not be formed in some cases.

The hole transport layer is a layer made of hole transport material, and examples of the hole transport material include poly (3,4-ethylenedioxythiophene) doped with polyethylene sulfonic acid (also referred to as PEDOT-PSS) and its derivative (e.g., copolymers). The thickness of the hole transport layer is usually 10 nm or more and 100 nm or less and may be approximately 30 nm. The material of the hole transport layer may be an metal oxide such as $WO_x$ (tungsten oxide), $MoO_x$ (molybdenum oxide), $VO_x$ (vanadium oxide) or a combination thereof.

The interlayer has a role to block transportation of electrons to the hole transport layer and to efficiently transport holes to the polymer organic EL layer and is a layer made of, for example, polyaniline material. The thickness of the interlayer is usually 10 nm or more and 100 nm or less and may be approximately 40 nm.

As mentioned above, the present invention is characterized in that the hole transport layer or the interlayer can be formed by means of so-called "overall coating". That is, the hole transport layer or the interlayer may be easily formed by means of "plane formation" or "line formation" by a technique such as spin coating, die coating or slit coating, with their thickness being made uniform.

As used herein, "plane formation" means formation of a functional layer (e.g., a hole transport layer or interlayer) as a single layer over the substrate, including a plurality of pixel regions, on which the anode electrodes are provided. In addition, "line formation" as used herein means formation of a line-state functional layer for each of line-state pixel regions on a display panel which will be described later.

The organic EL display panel of the present invention preferably includes a polymer organic EL layer as a light-emitting layer. The organic EL layer may be formed in lines (line formation) in pixel regions defined by first banks which will be described later.

The polymer organic EL material is selected as appropriate so that a desired color (red (R), green (G), or blue (B)) is generated from each pixel. For example, a green pixel is arranged adjacent to a red pixel, a blue pixel is arranged adjacent to the green pixel, and a red pixel is arranged adjacent to the blue pixel.

By applying an ink containing a polymer organic EL material and solvent on the pixel region by a coating method such as ink-jetting, an organic EL layer is formed easily while avoiding damages to the other materials. Examples of the polymer organic EL material include poly phenylene vinylene (PPV) and its derivatives, poly acetylene and its derivatives, poly phenylene (PPP) and its derivatives, poly para phenylene ethylene (PPV) and its derivatives, poly 3-hexyl thiophene (P3HT) and its derivatives, poly fluorene (PF) and its derivatives, and the like. The thickness of the polymer organic EL layer is preferably approximately 50 to 100 nm (60 nm, for example).

The organic EL display of the present invention has first banks defining pixel regions.

The first banks are formed in lines for defining pixel regions. The first banks preferably run in parallel with each other. In addition, when anode electrodes are arranged in lines, the line-state first banks are preferably orthogonal to the lines of the anode electrodes.

The first bank may be either tapered or inverted tapered. If the first bank has inverted tapered shape, as will be described later, energization between adjacent cathodes is prevented. On the other hand, if the first bank has tapered shape, the cathode electrodes may be made thinner as compared with the inverted tapered first banks.

Any material can be selected for the first bank as long as it is insulating, and it is preferably made of insulating resin (such as polyimide). The surface of the first bank preferably has low lyophilicity (e.g., water repellency). The contact angle of the first bank with respect to water is 60° or more, for example. Thus, the material of the first bank is preferably made of insulating resin containing a fluorine resin. Alternatively, lyophilicity may be lowered by fluorinating the surface of the first bank by fluorine gas plasma.

The first banks may be formed by a photolithographic method that includes an exposure/development process, and may also be formed by intaglio printing or the like. If it is formed by intaglio printing or the like, other materials (e.g., hole transport layer) are hardly damaged.

The first banks define pixel regions and also can function as a cathode separator. The cathode separator is a member for dividing a cathode electrode (which will be described later), dividing the cathode electrode formed on the organic EL layer by, for example, deposition for each line-state pixel regions.

The organic EL display panel of the present invention has a cathode electrode layer on the polymer organic EL layer. The material of the cathode electrode layer changes depending on whether it is of top emission type or bottom emission type. In the case of top emission type, the cathode electrode needs to be transparent, and therefore, an ITO electrode or IZO electrode is preferably formed. A buffer layer and the like are preferably formed between the polymer organic EL layer and the cathode electrode layer. On the other hand, in the case of bottom emission type, there is no need for the cathode electrode to be transparent, and therefore, an electrode made of any material may be used.

It is only necessary that the cathode electrode be formed on the organic EL layer set in each pixel region, but it is usually formed so as to cover the entire pixel regions (See FIG. 1A). Usually, first banks serve as a cathode separator so that the separated cathode electrodes in mutually adjacent pixel regions are not energized to each other. Since the cathode electrode layer is usually formed by the deposition method, by forming the first banks in inverted taper shape (See FIG. 8), energization between adjacent cathode electrodes is prevented more surely. It may be that the cathode electrodes do not have to be separated for each pixel region. That is, when the anode electrodes are independently controlled at each pixel electrode as in the active matrix type, the TFT elements driving the pixel electrode is independent and thereby the cathode electrode may be shared by a plurality of pixel regions.

For sealing, on the organic EL display panel of the present invention, a cover material may further be provided on the surface on which the cathode electrode is formed. The cover material suppresses intrusion of water or oxygen.

The organic EL display panel of the present invention may further have an electrically insulating inorganic film (hereinafter referred to as "inorganic insulating film"). It is needless to say that the inorganic insulating film is electrically insulating, but it is preferable that the inorganic insulating film further have high lyophilicity. Examples of materials of the inorganic insulating film include silicon oxide ($SiO_2$), silicon nitride ($Si_3N_4$), silicon oxynitride (SiON) and the like. The thickness of insulating inorganic film is preferably 10 to 200 nm.

Figure 9:
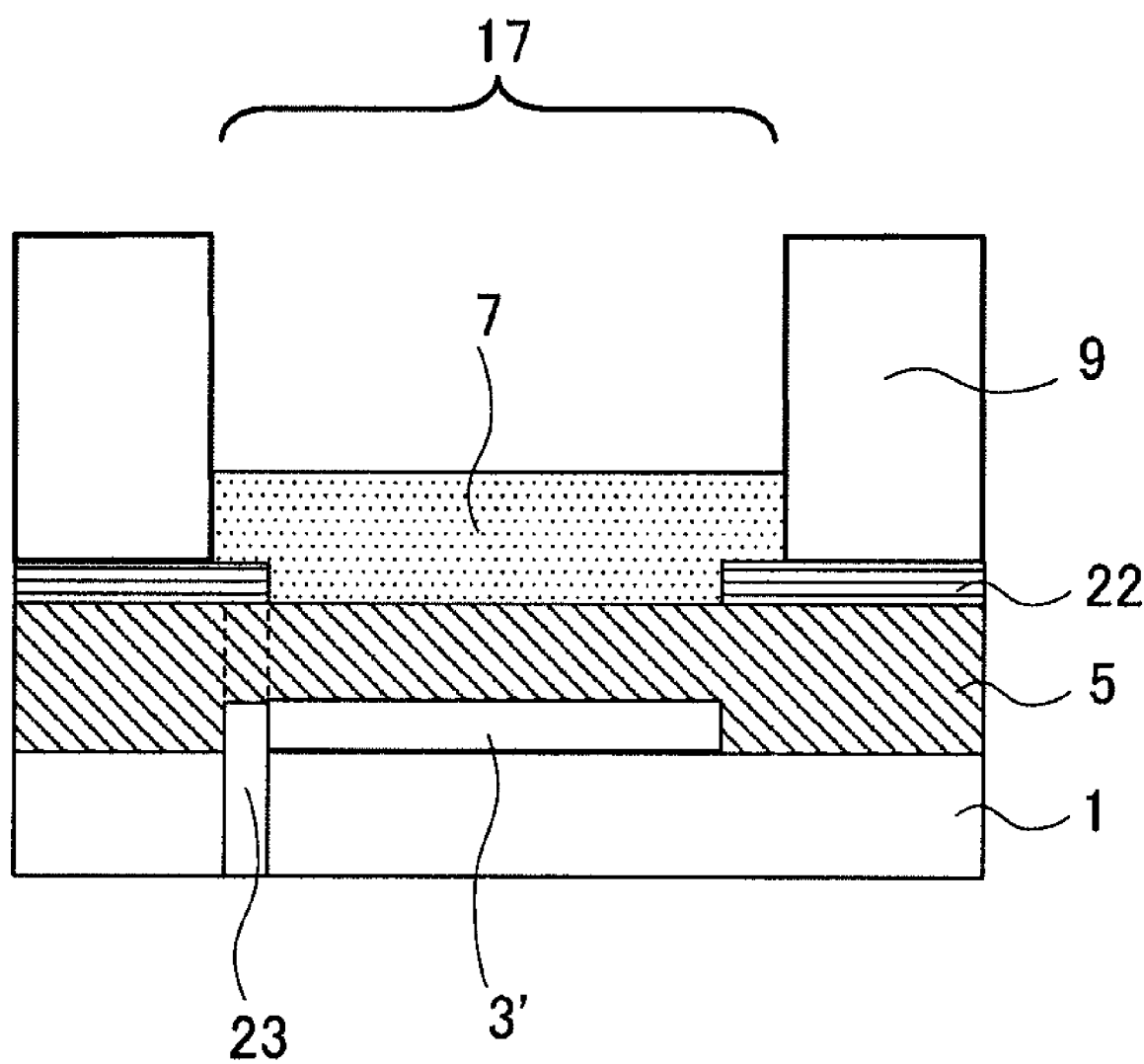
FIG. 9 is a sectional view of the organic EL display panel having an insulating film under an interlayer.
Figure 10A:
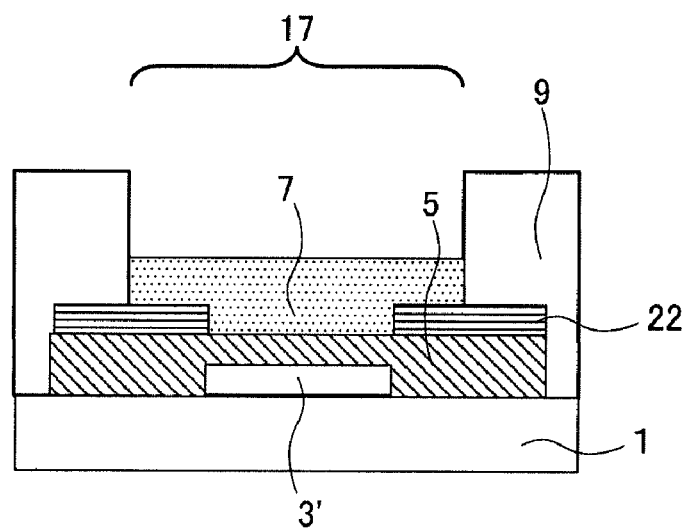
FIG. 10 is a sectional view of the organic EL display panel having an insulating film under an interlayer.
Figure 10B:
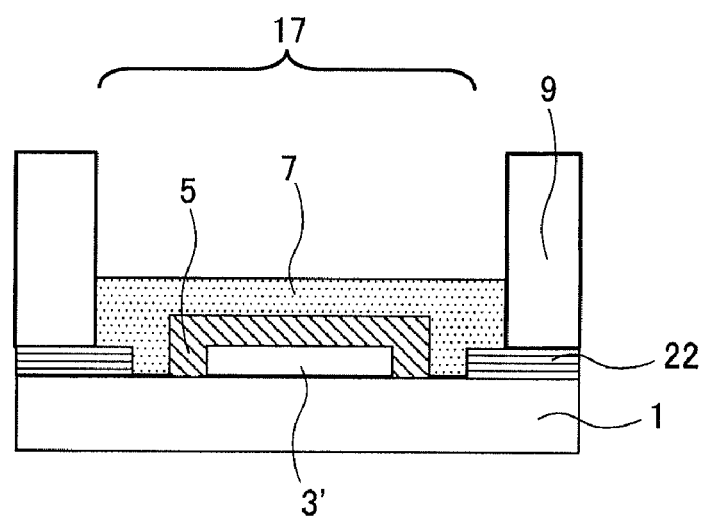
Figure 10C:
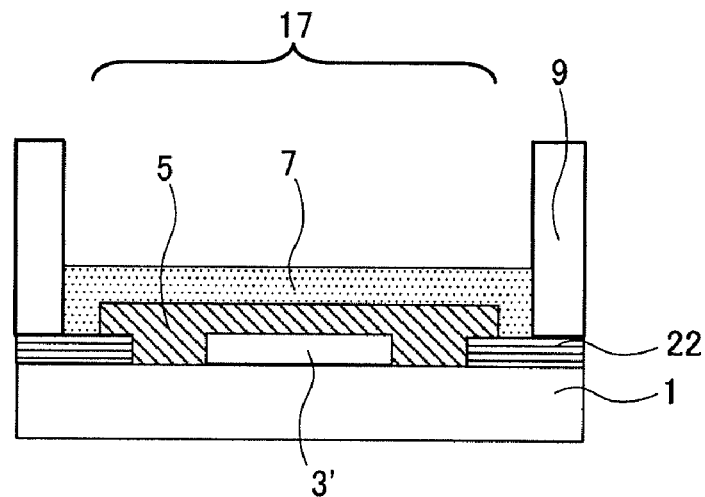
Figure 11:
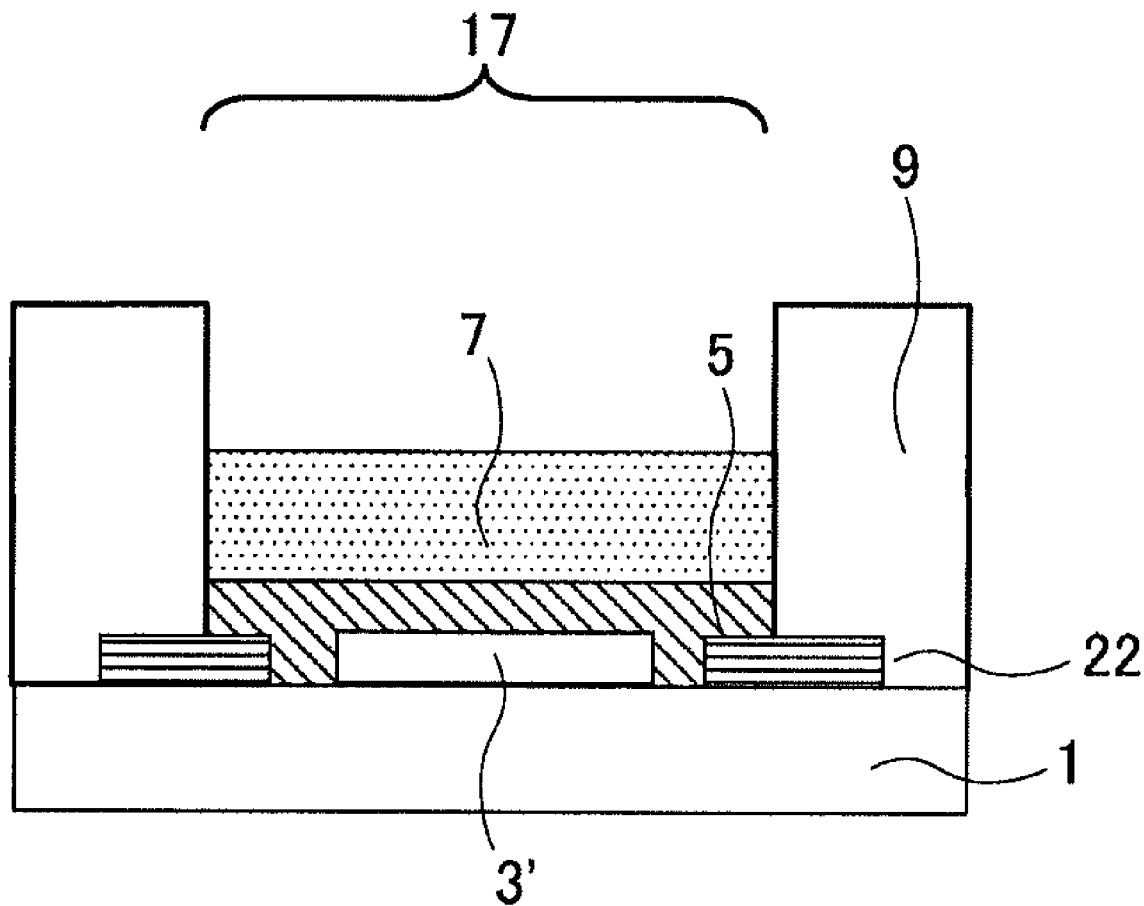
FIG. 11 is a sectional view of the organic EL display panel having an insulating film under a hole transport layer.

The inorganic insulating film preferably protrudes from the bank into the pixel region (See FIGS. 9, 10, and 11). The inorganic insulating film preferably protrudes from the bank into the pixel region by 5 to 10 μm.

A solution containing a material of the functional layer (polymer organic EL layer, hole transport layer or interlayer) is applied on the inorganic insulating film protruding from the bank. The solution is applied on the entire pixel region uniformly by the inorganic insulating film, and a functional layer with a uniform film thickness can be obtained.

In addition, as shown in FIG. 9, since inorganic insulating film 22 protrudes up to sub pixel region 17, holes injected from contact hole 23 are prevented from intruding into the polymer organic EL layer. As a result, light emission from unwanted spots (e.g., contact holes) can be prevented.

As mentioned above, the organic EL display panel of the present invention has first banks and an optional inorganic insulating film protruding from each of the first banks. The configurations (shapes and arrangements) of the first bank and inorganic insulating film can be classified into the following three categories (1) to (3) according to the configurations of the hole transport layer and the interlayer. The shapes and arrangements of the first banks and insulating inorganic film will be described below for each category.

(1) When the hole transport layer is provided by means of plane formation (See FIGS. 2, 4, 5, and 9)

Hole Transport Layer

In this category, the hole transport layer is provided by means of plane formation. The material of the hole transport layer is preferably an oxide such as tungsten oxide.

Interlayer

In this category, the interlayer is either provided by means of line formation in pixel regions which are defined in lines by the firsts bank on the hole transport layer, or provided by means of plane formation on the hole transport layer. Line formation is preferable.

First Bank

In this category, first banks are formed on a single hole transport layer or interlayer which has been formed by plane formation, and define regions of the polymer organic EL layer or regions of both of the interlayer and polymer organic EL layer (See FIGS. 2, 4, 5, and 9). More specifically, 1) if the interlayer is formed as a single layer by means of plane formation, first banks are formed on the interlayer so as to define regions of the polymer organic EL layer (See FIG. 5); and 2) if the line-state interlayers are to be provided by means of line formation, the first banks are formed on the hole transport layer so as to define regions of both of the interlayer and the polymer organic EL layer (See FIGS. 2, 4, and 9).

Preferably, the first banks are formed on the hole transport layer so as to define the line-state interlayer and polymer organic EL layer (See FIGS. 2, 4, and 9).

Polymer Organic EL Layer

The polymer organic EL layer is formed by means of line formation on the interlayer in pixel line regions defined by the first banks.

Inorganic Insulating Film

In this category, the inorganic insulating film is formed on the hole transport layer or the interlayer so as to be in contact with the bottom surface of the interlayer or the polymer organic EL layer (See FIG. 9). More specifically, 1) when the interlayer is formed as a single layer by means of plane formation, the inorganic insulating film is formed on the interlayer so as to be in contact with the bottom surface of the polymer organic EL layer; and 2) when the line-state interlayers are formed by means of line formation, the inorganic insulating film is formed on the hole transport layer so as to be in contact with the bottom surface of the interlayer (See FIG. 9).

Preferably, the inorganic insulating film is formed on the hole transport layer so as to be in contact with the bottom surface of the interlayer (See FIG. 9). Since the inorganic insulating film is set on the hole transport layer so as to be in contact with the bottom surface of the interlayer, when the interlayer is formed in lines by coating pixel regions defined by first banks with a solution containing the material of the interlayer, the film thickness of the interlayer may be made uniform (See FIG. 9).

The organic EL display panel of this category may be manufactured in the order of 1) hole transport layer (plane formation), 2) interlayer (plane formation), 3) first bank, and 4) polymer organic EL layer (line formation) or in the order of 1) hole transport layer (plane formation), 2) first bank, 3) interlayer (line formation), and 4) polymer organic EL layer (line formation).

Preferably, the organic EL display of this category is manufactured in the order of 1) hole transport layer (plane formation), 2) first bank, 3) interlayer (line formation), 4) polymer organic EL layer (line formation).

(2) When the hole transport layer is formed in lines and the material of the hole transport layer is an oxide such as tungsten oxide (See FIG. 10)

Hole Transport Layer

In this category, the material of the hole transport layer is an oxide such as tungsten oxide. The hole transport layer is formed in lines so as to be located in regions defined by first banks which will be described later. The hole transport layer is preferably formed so as to cover the anode electrode.

Interlayer

In this category, the interlayer is either formed by means of line formation in the pixel regions defined by the first banks, or formed by means of plane formation on the hole transport layer or substrate. The interlayer is preferably formed in lines.

First Bank

In this category, first banks are formed on the substrate (See FIG. 10) or interlayer and define regions of the polymer organic EL layer or regions of both of the interlayer and polymer organic EL layer. More specifically, 1) when the interlayer is provided as a single layer by means of plane formation, first banks are formed on the interlayer and define regions of the polymer organic EL layer; and 2) when the line-state interlayers are to be provided by means of line formation, the first banks are formed on the substrate and define regions of the interlayer and polymer organic EL layer.

Preferably, the first banks are formed on the substrate (See FIG. 10) and define regions of the interlayer and polymer organic EL layer.

Polymer Organic EL Layer

The polymer organic EL layer is in lines (line formation) on the interlayer in pixel line regions defined by the first banks.

Inorganic Insulating Film

In this category, the inorganic insulating film is formed so as to be in contact with the bottom surface of the interlayer or the polymer organic EL layer (See FIG. 10). More specifically, 1) when the interlayer is formed as a single layer by means of plane formation, the inorganic insulating film is formed on the interlayer so as to be in contact with the bottom surface of the polymer organic EL layer; and 2) when the line-state interlayers are formed, the inorganic insulating film is formed so as to be in contact with the bottom surface of the interlayer (See FIG. 10).

Preferably, the inorganic insulating film is formed so as to be in contact with the bottom surface of the interlayer (See FIG. 10). The inorganic insulating film may be set on the hole transport layer (FIG. 10A), may be set on the substrate (FIG. 10B) or may be set on the substrate and below the hole transport layer (FIG. 10C) as long as it is formed so as to be in contact with the bottom surface of the interlayer. By forming the inorganic insulating film so as to be in contact with the bottom surface of the interlayer, when the line-state interlayers are formed by coating the pixel regions defined by the first banks with a solution containing a material of the interlayer, the film thickness of the interlayer may be made more uniform (See FIG. 10). In addition, by setting the inorganic insulating film between the first bank and the hole transport layer (FIG. 10A), adhesion between the first bank and the hole transport layer made of oxide is reinforced.

The organic EL display panel in this category may be manufactured in the order of 1) hole transport layer (line formation), 2) interlayer (plane formation), 3) first bank, and 4) polymer organic EL layer (line formation), or may be manufactured in the order of 1) hole transport layer (line formation), 2) first bank, 3) interlayer (line formation), and 4) polymer organic EL layer (line formation).

Preferably, the organic EL display panel of this category is manufactured in the order of 1) hole transport layer (line formation), 2) first bank, 3) interlayer (line formation), and 4) polymer organic EL layer (line formation).

(3) When the hole transport layer is in lines and the material of the hole transport layer is PEDOT-PSS (See FIG. 11)

Hole Transport Layer

In this category, the hole transport layer is in lines (line formation) by applying PEDOT-PSS in pixel line regions defined by first banks which will be described later.

Interlayer

In this category, the interlayer is formed in lines (line formation) on the hole transport layer in pixel line regions defined by first banks.

Polymer Organic EL Layer

The polymer organic EL layer is formed in lines (line-formed) on the interlayer in the line pixel regions defined by first banks.

First Bank

In this category, first banks are formed on the substrate and define regions of the hole transport layer, interlayer, and polymer organic EL layer (See FIG. 11).

Inorganic Insulating Film

The inorganic insulating film in this category is set on the substrate so as to be in contract with the bottom surface of the hole transport layer (See FIG. 11). Since the inorganic insulating film is formed in contact with the bottom surface of the hole transport layer, the film thickness of the hole transport layer prepared using PEDOT-PSS may be made more uniform.

The organic EL display panel of this category is preferably manufactured in the order of 1) first bank, 2) hole transport layer (line formation), 3) interlayer (line formation), and 4) polymer organic EL layer (line formation).

As mentioned above, in the organic EL display panel of the present invention, the arrangements of the first banks and the inorganic insulating film layer change depending on the form (shapes and constituent materials) of the hole transport layer and the interlayer. On the other hand, the arrangements of the polymer organic EL layer, the cathode electrode and second banks which will be described later are common in the above three categories.

The organic EL display panel of the present invention may further have second banks.

The second banks define two or more sub pixel regions in a pixel region. The second bank may be set on the hole transport layer or may be set on the interlayer. When the second banks are set on the hole transport layer, the interlayer and the polymer organic EL layer are defined by the second banks. On the other hand, when the second banks are set on the interlayer, the polymer organic EL layer is defined by the second banks.

The second banks are preferably set on the hole transport layer and define the interlayer and polymer organic EL layer.

The material of the second bank is not particularly limited as long as it is insulating as with the first bank, and it is preferably an insulating resin. By the second banks, electrical cross-talk between the pixels may be suppressed. Further, the material of the second bank is preferably in black color. Since the second banks define sub pixel regions, by making the bank be in a color having high contrast with the light emitted from the sub pixel regions, a display panel with high brightness is obtained.

Moreover, since the second banks defining the sub pixel regions are set on the hole transport layer or interlayer, the second banks and the hole transport layer or interlayer are preferably brought into close contact with each other. Therefore, the lyophilicity on the surface of the second bank may be increased to a level higher than that of the surface of the first bank so as to enhance adhesion with the hole transport layer or interlayer. For example, the contact angle of the second bank with respect to water is 40 degrees or less. Thus, the material of the second bank may be non-fluorine resin (e.g., non-fluorine polyimide resin, or non-fluorine polyacrylic resin).

As mentioned above, the second bank is formed on the hole transport layer or the interlayer. Therefore, the hole transport layer or the hole transport layer and the interlayer may be manufactured by so-called "over-all application". That is, the hole transport layer and the inter layer are formed easily by spin-coating, die-coating, slit-coating and the like and moreover, their thickness are made uniform.

The depth of the second bank may only be approximately 1 to 2 μm. In addition, the height of the top of the first bank from the substrate is preferably higher than that of the second bank by approximately 1 to 10 μm. It is for preventing the intrusion of inks into adjacent pixel regions by setting the banks defining the pixel regions higher, since an organic EL layer is formed by applying inks containing a polymer organic EL material and solvent in the pixel regions defined by the first banks, as will be described later.

Figure 3:
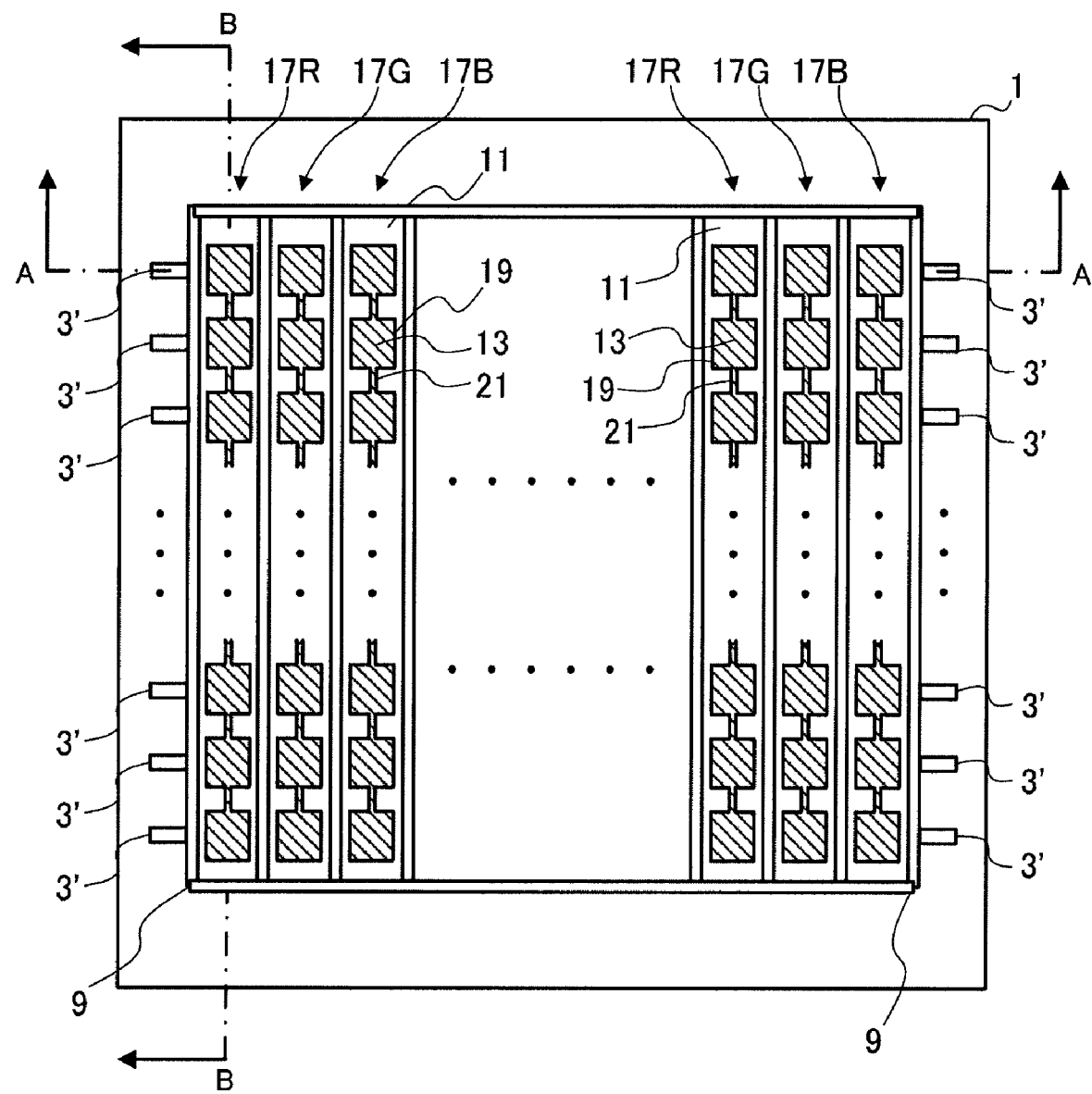
FIG. 3 is a plan view of the organic EL display panel in a state where a cathode electrode is removed.

To the second bank for defining sub pixel regions, a groove for connecting adjacent sub pixel regions with each other may be provided (See FIG. 3). After the second banks are formed, in the sub pixel regions defined by the second banks, a solution containing the material of the interlayer or an ink containing a polymer organic EL material may be applied in the pixel regions. Therefore, when such grooves are provided, the solution or ink moves between the sub pixel regions and thereby the thickness of the interlayer or the organic EL layer to be formed is leveled out in the pixel regions. The depth of the groove may only be within 90% of the depth of the second bank, and the width of the groove may only be approximately 20 to 50 μm. Further, the interval between the adjacent sub pixel regions is usually 10 μm or more. The lateral width of the sub pixel region (as lateral when the running direction of the first bank is deemed to be vertical) is approximately 60 to 100 μm.

2. A method of manufacturing an organic EL display panel of the present invention The organic EL display panel of the present invention may be manufactured by any method as long as the effect of the present invention is not impaired.

A first example of a preferred manufacturing method includes the steps of 1) forming a first conductive layer as a single layer over a substrate; 2) forming a hole transport layer on the substrate on which the first conductive layer is formed; 3) forming electrically insulating banks in lines on the hole transport layer so as to define regions that serve line-state pixel regions; 4) forming a line-state organic EL layers in the regions; and 5) forming a second conductive layer on the organic EL layer.

In the 1) step, the first conductive layer may be formed by forming a conducting thin film on the substrate and by patterning it in lines (See FIG. 3) or in matrix form (See FIG. 1B) by photolithography or etching, which method is not particularly limited. The first conductive layer serves as an anode electrode.

In the 2) step, when the material of the hole transport layer is PEDOT-PSS, in order to provide the hole transport layer on the substrate with the first conductive layer by means of plane formation, spin coating, die coating, slit coating or the like is preferably employed. Although they are simple methods, a layer with a relatively uniform thickness may be formed. On the other hand, when the material of the hole transport layer is a metal oxide such as tungsten oxide, the hole transport layer is formed by sputtering method or heating deposition method, for example.

In the 3) step, electrically insulating line-state banks defining pixel regions are formed on the hole transport layer. When the first conductive layer is formed in lines (See FIG. 3), the line-state banks are preferably orthogonal to the line-state conductive layers. The banks may be formed by applying a resist on the hole transport layer and by exposing via a photomask, or by printing an insulating resin molded product by intaglio printing. In the former method, the hole transport layer or the interlayer may be damaged by irradiated light, therefore the latter method is preferably employed. Region to be pixel regions are defined by the line-state banks. In addition, the banks may serve as a cathode electrode separator.

In the banks region, second electrically insulating banks may be further formed. The banks may be formed by applying a resist on the hole transport layer and by exposing it via a photomask, or by printing an insulating resin by intaglio printing. By these banks, a plurality of regions to be sub pixels is defined. In addition, while the banks define regions to be sub pixels, they may have a groove for connecting adjacent sub pixel regions with each other. The groove may be formed by etching or the like. Alternatively, a resin molded product in which a groove is formed in advance by intaglio printing may be printed.

Either the formation of electrically insulating line-state banks or formation of regions defining regions to be sub pixels may precede the other or may be carried out at the same time. For example, when the insulating resin is printed by intaglio printing, both banks are formed at the same time by printing a resin molded product in a desired shape.

The example of this manufacturing method may have a step of forming the interlayer before or after the 3) step. That is, when the interlayer is formed before the 3) step, the interlayer is preferably formed by means of plane formation on the hole transport layer. On the other hand, when the interlayer is formed after the 3) step, the interlayer is preferably formed by means of line formation in the pixel regions defined by the banks after formation of the electrically insulating line-state banks.

In order to form the interlayer, spin coating, die coating, slit coating or the like is preferably employed.

The example of this manufacturing method may have a step of forming the inorganic insulating film before formation of the interlayer and before the 3) step, or after formation of the interlayer and before the 3) step.

That is, when the interlayer is formed by means of plane formation, the inorganic insulating film is formed on the interlayer and below the electrically insulating banks. On the other hand, when the interlayer is formed by means of line formation, the inorganic insulating film is formed on the hole transport layer and below the electrically insulating banks.

The inorganic insulating film is formed by plasma CVD or sputtering, for example.

The hole transport layer may be formed on the entire substrate surface but it may only be formed in regions at least including all of the pixel regions.

Usually, both the hole transport layer and the interlayer are formed, but the hole transport layer might not be formed.

The pixel region defined in the 4) step is coated with an ink containing a polymer organic EL material and solvent. The coating may be applied by using a technique such as ink-jet, dispensing, nozzle coating, intaglio printing, letterpress printing or the like. When coating is applied using a dispenser, ink discharge from the dispenser is preferably controlled by a suck-back operation and the like at the beginning and end of each line-wise application. The thickness of the applied ink (thickness of the coat film) may be approximately 1 to 10 μm. Further, by drying the coat film, a layer including the polymer organic EL material is formed and, preferably formed in the sub pixel region in the pixel region selectively.

A layer including a polymer organic EL material may be further rubbed. Specifically, rubbing may be carried out using a coater or the like. By rubbing treatment, the structural units of polymer can be highly aligned, leading to increased light-emission efficiency.

In the 5) step, a second conductive layer is formed on the organic EL layer. The second conductive layer may be made by deposition method. By forming electrically insulating banks with inverted taper shape, the second conductive layer may be cut off at each pixel more assuredly.

A second example of the preferred manufacturing method includes the steps of 1) forming a first conductive layer on a substrate; 2) forming electrically insulating line-state banks so as to define regions to be line-state pixel regions on the substrate on which the first conductive layer is formed; 3) forming a line-state hole transport layer in the region to be a pixel region; 4) forming a line-state interlayer in the region to be a pixel region; 5) forming a line-state polymer organic EL layer in the region to be a pixel region; and 6) forming a second conductive layer on the organic EL layer.

In addition, the above manufacturing method may include between the 1) step and the 2) step a step of forming an insulating inorganic film (hereinafter referred to as "inorganic insulating film") on the substrate. In this case, the electrically insulating banks are preferably formed on the inorganic insulating film.

Further, when the material of the hole transport layer is an oxide such as tungsten oxide, the order of the 2) step and the 3) step may be reversed.

The step of forming the first conductive layer on the substrate, the step of forming the line-state polymer organic EL layers, and the step of forming the second conductive layer in the second example of the manufacturing method are similar to those in the first example and may be carried out in a similar manner.

In the 2) step, the electrically insulating line-state banks are formed on the substrate on which the first conductive layer is formed. When the first conductive layer is formed in lines, the line-state banks are preferably orthogonal to the line-state conductive layer. The banks may be formed by applying a resist on the substrate and by exposing it via a photomask, or by printing an insulating resin molded product by intaglio printing. The pixel regions are defined by the banks. The banks can be a cathode separator.

In the 3) step, the hole transport layer is formed in the pixel regions defined by the electrically insulating line-state banks and in the 4) step, the interlayer is formed in the pixel regions defined by the electrically insulating line-state banks and on the hole transport layer. The hole transport layer or the interlayer may be formed by means of spin coating, die coating, slit coating, or the like.

It may be configured that the second electrically insulating banks are formed on the hole transport layer in the pixel regions so as to define sub pixel regions. The banks defining sub pixel regions may be formed by applying a resist on the hole transport layer and by exposing it via a photomask, or by printing an insulating resin molded product by intaglio printing.

After sub pixel regions are defined, the pixel region is coated with an ink containing a polymer organic EL material and solvent so as to form an organic EL layer as with the manufacturing method of the first example.

Embodiments of the present invention will be described below in more detail referring to the attached drawings.

Embodiment 1

In Embodiment 1, an active matrix type organic EL display panel in which a hole transport layer is provided as a single layer by means of plane formation will be described.

FIG. 1A is a plan view of an active matrix type organic EL display panel. In the panel shown in FIG. 1A, line-state first banks 9 formed are provided. First banks 9 define pixel regions 17. The pixel regions 17 are of three types: pixel regions 17R emitting red light; pixel regions 17G emitting green light; and pixel regions 17B emitting blue light. These three types of pixel regions are arranged in order. Pixel regions 17 are covered by cathode electrode 15 and separated by first banks 9 as discrete pixel regions.

Figure 1B:
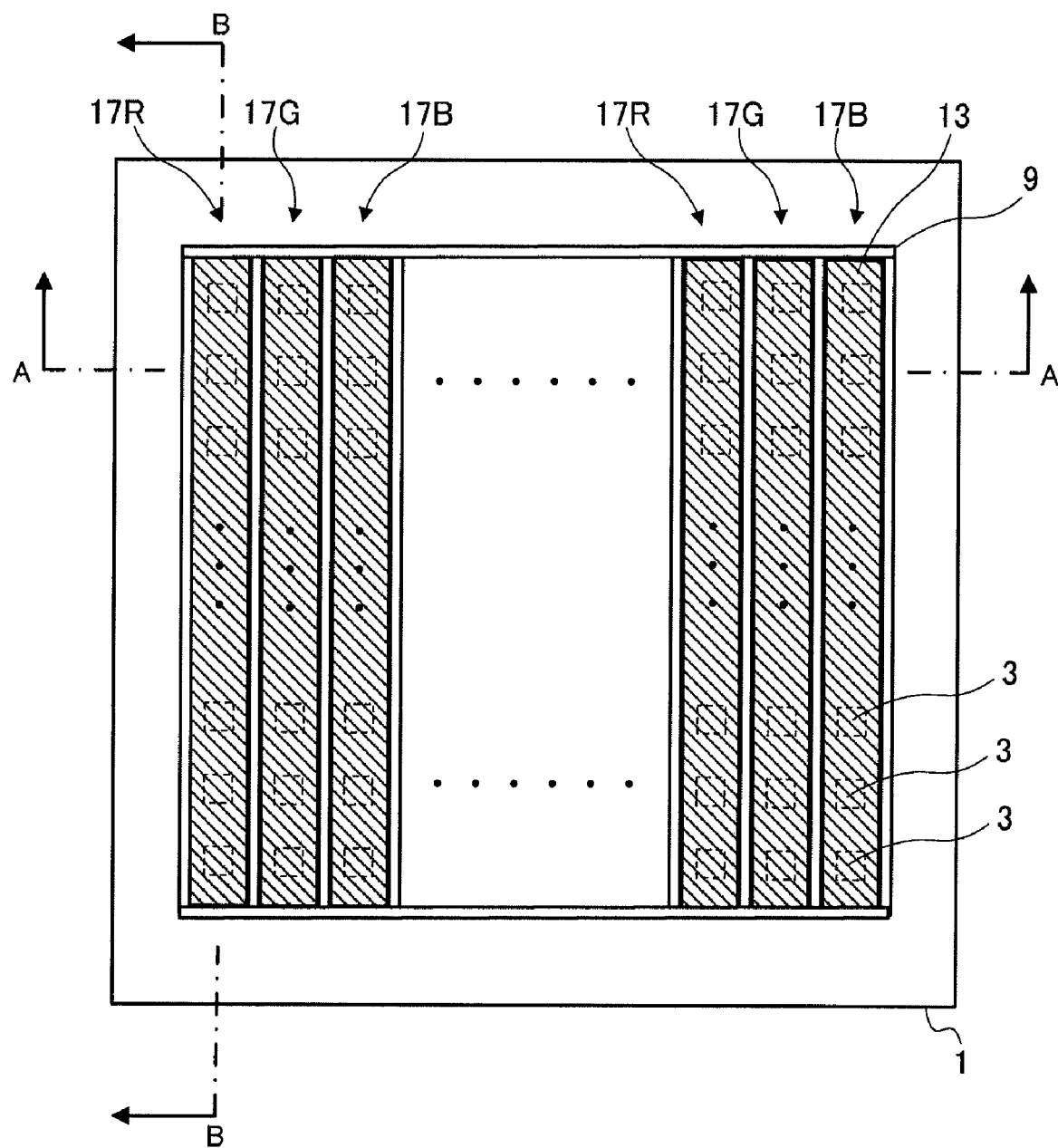
FIG. 1B is a plan view of the organic EL display panel in a state where a cathode electrode is removed.

FIG. 1B is a plan view of the organic EL display panel of active matrix type of the present embodiment from which the cathode electrode is removed.

Figure 2A:
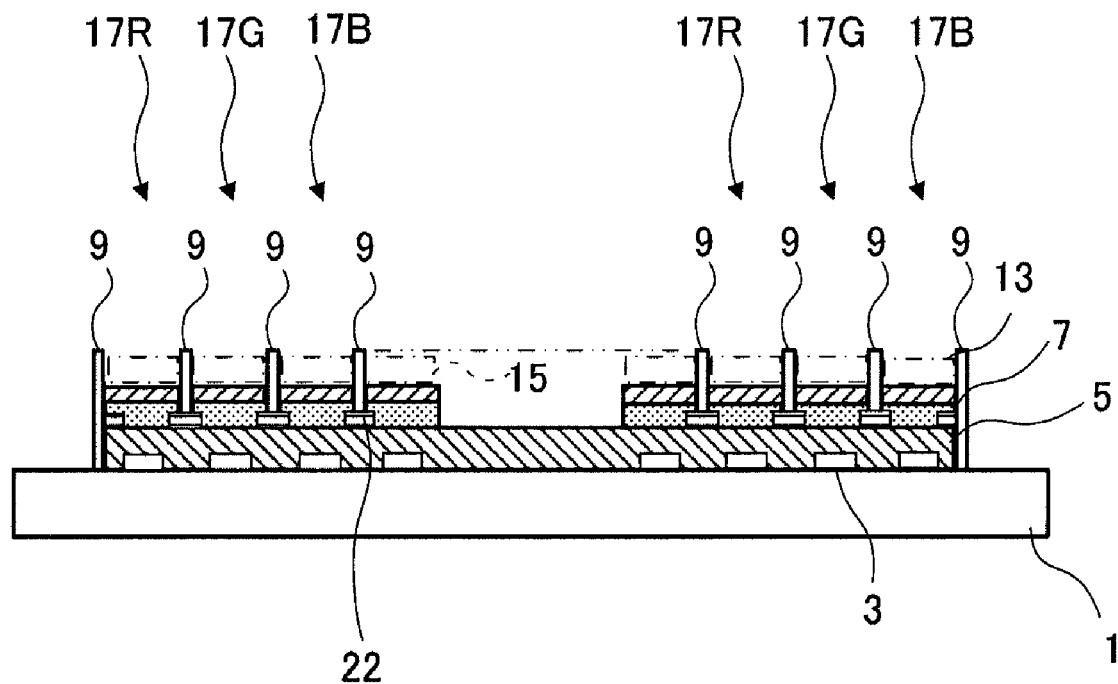
FIG. 2A is an A-A sectional view of the organic EL display panel shown in FIG. 1 in Embodiment 1.
Figure 2B:
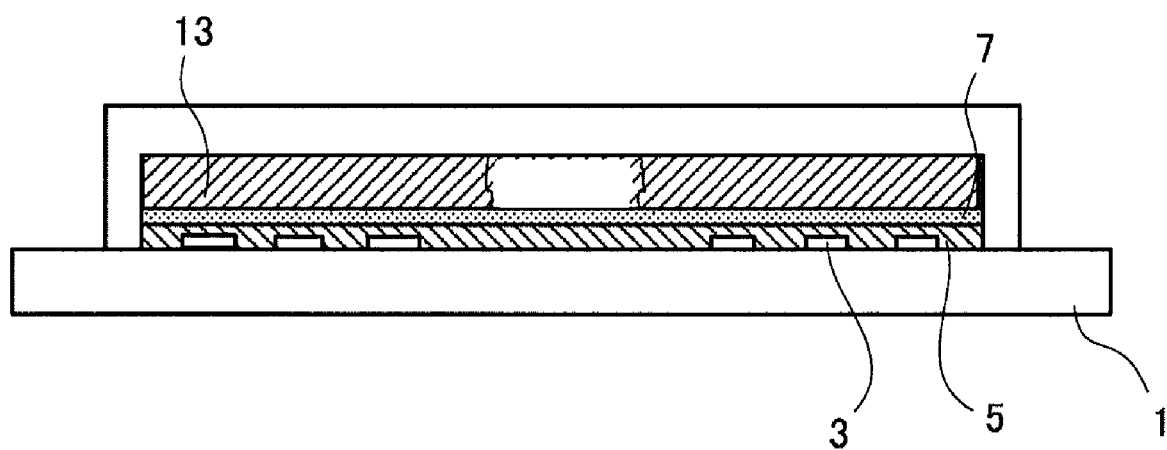
FIG. 2B is a B-B sectional view of the organic EL display panel shown in FIG. 1 in Embodiment 1.

FIG. 2A shows a line A-A sectional view of the organic EL display panel of the present embodiment shown in FIG. 1B. FIG. 2B shows a line B-B sectional view of the organic EL display panel of the present embodiment shown in FIG. 1B.

As shown in FIGS. 2A and 2B, in the present embodiment, Anode electrodes 3 are formed on substrate 1 in matrix form. Single hole transport layer 5 is formed by means of plain formation on substrate 1 so as to cover anode electrodes 3. First banks 9 are formed on inorganic insulating film 22 on hole transport layer and define pixel regions 17. First bank 9 is preferably made of fluorine resin in order to lower lyophilicity. Interlayer 7 is formed on hole transport layer 5 in pixel region 17. In pixel region 17 on interlayer 7, polymer organic EL layer 13 is set.

Embodiment 2

In Embodiment 1, the active matrix type organic EL display panel was explained. In Embodiment 2, a passive matrix type organic EL display panel will be described. In the present embodiment, the organic EL display panel has second banks.

FIG. 3 is a plan view of a state where cathode electrode 15 is removed from the organic EL display in the present embodiment. In the panel shown in FIG. 3, substrate 1, line-state anode electrodes 3', and line-state first banks 9 are set. The line direction (lateral direction in the figure) of anode electrodes 3', and the line direction (vertical direction in the figure) of first banks 9 are orthogonal to each other.

Inside pixel region 17, two or more sub pixel regions 19 defined by second banks 11 are set. Adjacent sub pixel regions 19 in region 17 are connected with each other by grooves 21. In sub pixel regions 19 and grooves 21, polymer organic EL material 13 with corresponding color is provided.

Figure 4A:
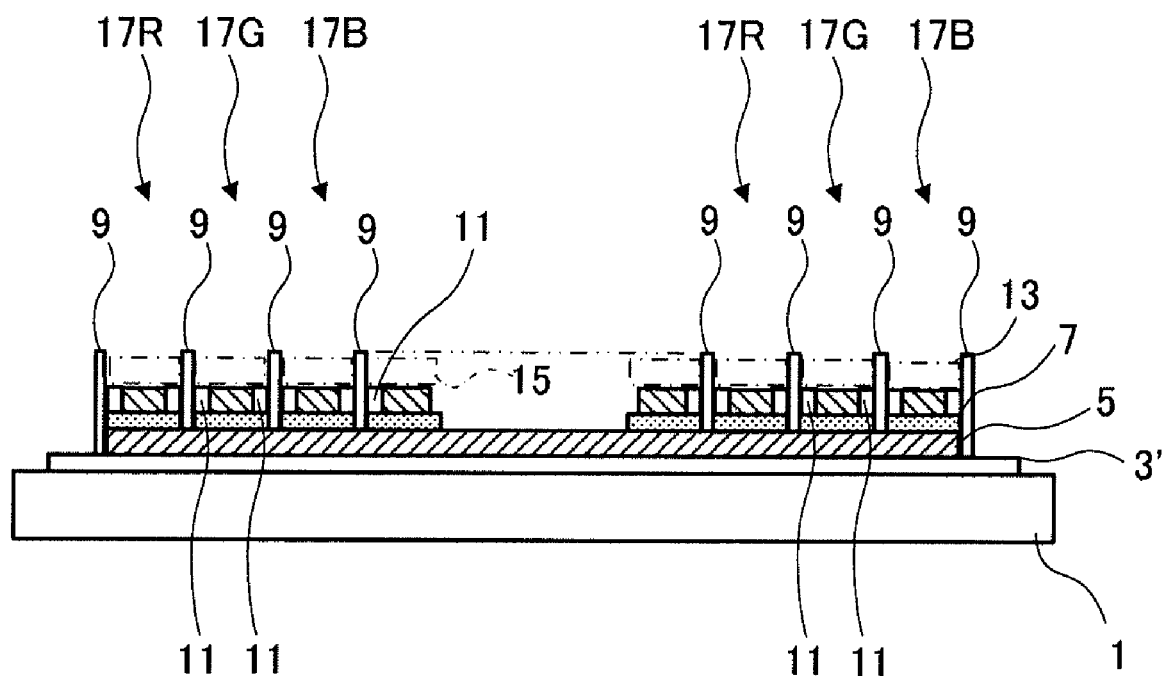
FIG. 4A is an A-A sectional view of the organic EL display panel shown in FIG. 3 in Embodiment 2.
Figure 4B:
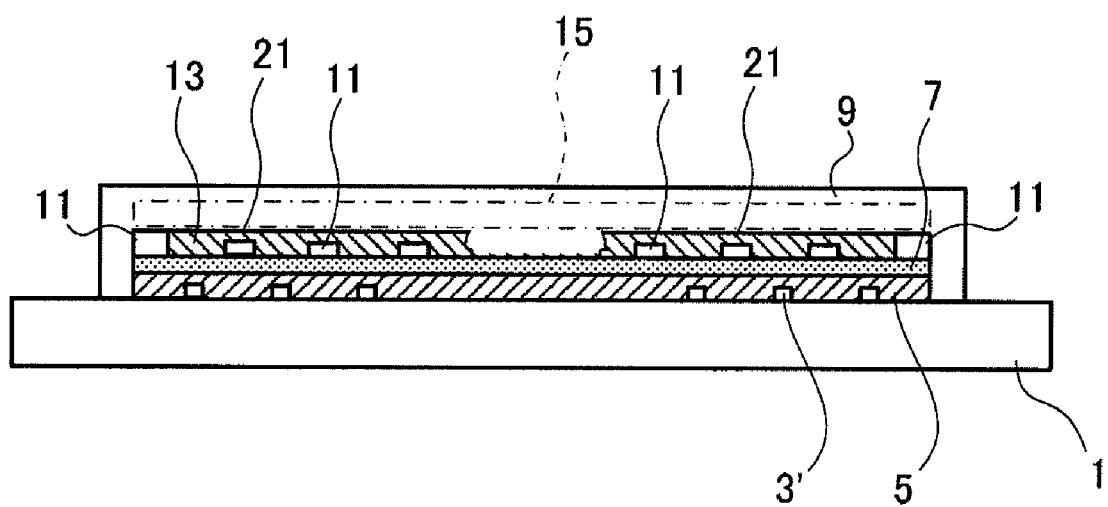
FIG. 4B is a B-B sectional view of the organic EL display panel shown in FIG. 3 in Embodiment 2.

FIG. 4A shows a line A-A sectional view of the organic EL display panel of the present embodiment shown in FIG. 3. FIG. 4B shows a line B-B sectional view of the organic EL display panel of the present embodiment shown in FIG. 3.

As shown in FIGS. 4A and 4B, the organic EL display panel of the present embodiment is the same as the organic EL display panel of Embodiment 1 except that it has anode electrode 3' and second banks 11 and has no inorganic insulating film 22. Therefore, the same reference numerals are given to the same members as those in the organic EL display panel in Embodiment 1 and the description thereof will be omitted.

As shown in FIGS. 4A and 4B, line-state anode electrodes 3' are set on substrate 1. Single hole transport layer 5 is formed by means of plane formation on substrate 1 so as to cover anode electrodes 3'.

On interlayer 7, second banks 11 are set so as to define sub pixel regions 19. The top of first bank 9 is higher than the top of second bank 11, from substrate 1. The difference in height is 1 μm or more and 10 μm or less, for example. In addition, second banks 11 preferably have some lyophilicity in view their close contact with interlayer 7.

Polymer organic EL material 13 is patterned in sub pixel regions 19 or patterned in pixel regions 17.

As shown in FIG. 4B, internal second banks 11 are set lower than those at the periphery (right and left ends in the figure). Second banks 11 in the inside correspond to grooves 21 (See FIG. 3). Polymer organic EL layer 13 is set so as to cover internal second banks 11 (grooves 21). That is, grooves 21 connect adjacent sub pixel regions 19 with each other. When a polymer ink containing polymer organic EL material is applied on pixel regions 17 defined by first banks 9, when sub pixel regions 19 are discrete without being connected with each other, it would be difficult to form polymer organic EL layer 13 19 uniformly in each sub pixel region. On the other hand, when grooves 21 are provided, since the polymer ink applied on pixel regions 17 flows between sub pixel regions 19, the thickness of polymer organic EL layer 13 is leveled out.

Embodiment 3

In Embodiments 1 and 2, the organic EL display panel in which the hole transport layer is formed as a single layer by means of plane formation and the interlayer is formed in lines was described. For Embodiment 3, the organic EL display panel in which the interlayer is formed as a single layer by means of plane formation will be described. The organic EL display panel of the present embodiment is the passive matrix type and has second banks.

The plan view of the organic EL display panel of the present embodiment is the same as that of Embodiment 2. Therefore, FIG. 3 is also a plan view of the organic EL display panel of the present embodiment.

Figure 5A:
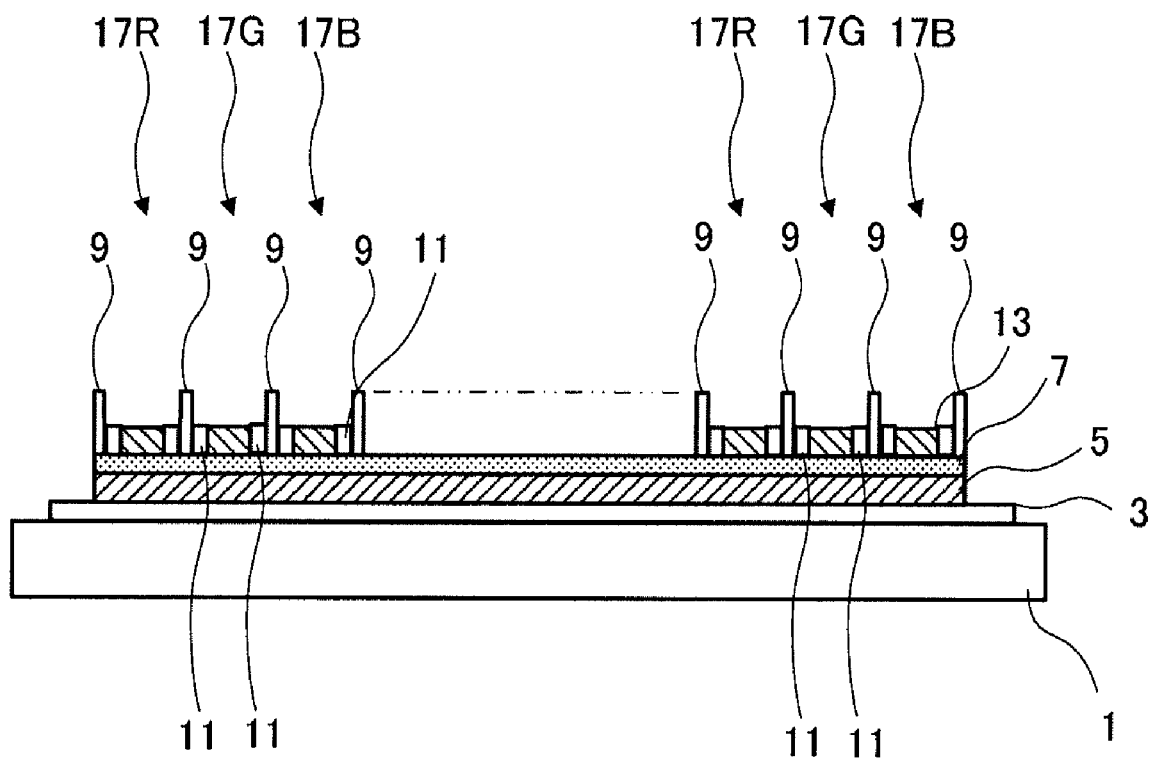
FIG. 5A is an A-A sectional view of the organic EL display panel shown in FIG. 3 in Embodiment 3.
Figure 5B:
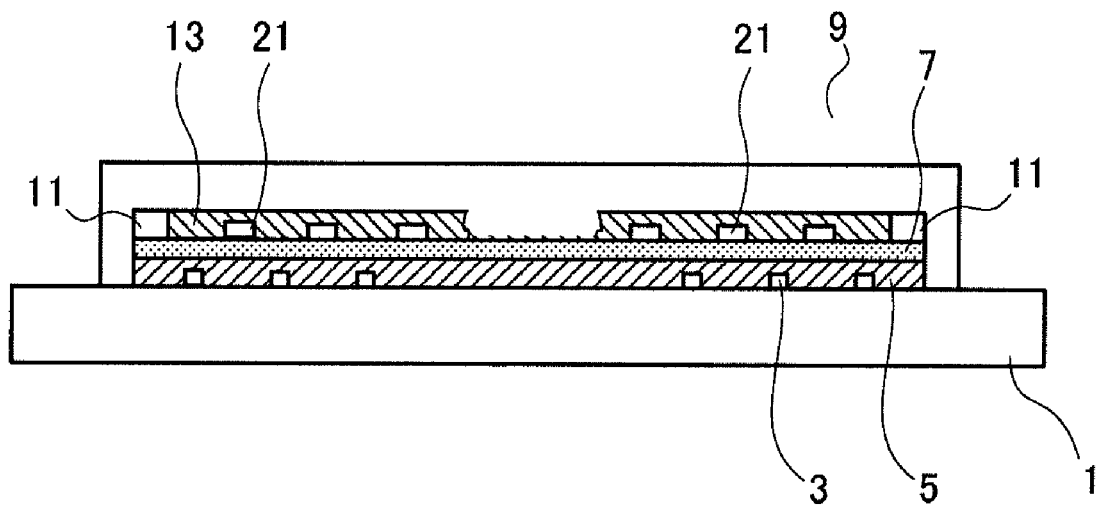
FIG. 5B is a B-B sectional view of the organic EL display panel shown in FIG. 3 in Embodiment 3.

FIG. 5A shows a line A-A sectional view of the organic EL display panel of the present embodiment shown in FIG. 3. FIG. 5B shows a line B-B sectional view of the organic EL display panel of the present embodiment shown in FIG. 3.

As shown in FIGS. 5A and 5B, the organic EL display panel of the present embodiment is the same as the organic EL display panel of Embodiment 2 except for the shape of interlayer 5 and the arrangement of first banks 9. Therefore, the same reference numerals are given to the same members as those of the organic EL display panel in Embodiment 2 and the description thereof will be omitted.

As shown in FIGS. 5A and 5B, interlayer 7 is as a single layer on single hole transport layer 5 formed by means of plane formation. On interlayer 7, first banks 9, second banks 11, and polymer organic EL layer 13 are set.

Embodiment 4

In Embodiments 1 to 3, the organic EL display panel in which hole transport layer is formed as a single layer by means of plane formation was described. In Embodiment 4, the organic EL display panel in which hole transport layer is formed in lines by means of line formation will be described. The organic EL display panel of the present embodiment is of active matrix type.

The plan view of the organic EL display panel of the present embodiment is the same as that of Embodiment 1. Therefore, FIGS. 1A and 1B are also plan views of the organic EL display panel of the present embodiment.

Figure 6A:
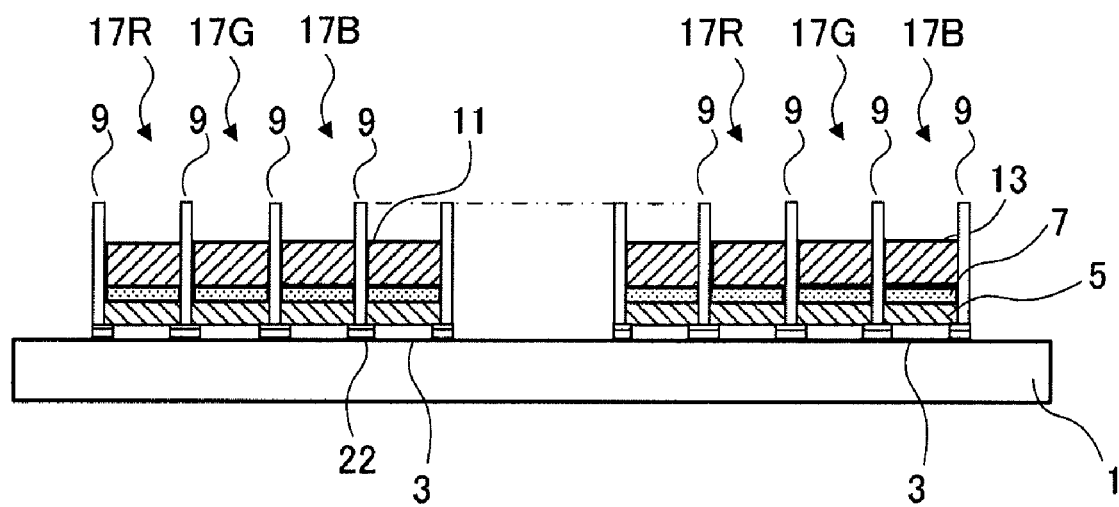
FIG. 6A is an A-A sectional view of the organic EL display panel shown in FIG. 1 in Embodiment 4.
Figure 6B:
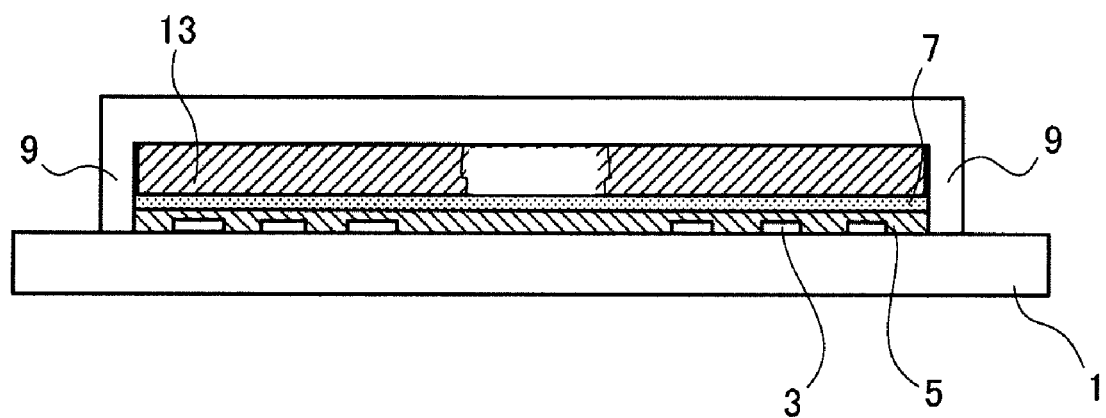
FIG. 6B is a B-B sectional view of the organic EL display panel shown in FIG. 1 in Embodiment 4.

FIG. 6A shows a line A-A sectional view of the organic EL display panel of the present embodiment shown in FIG. 1B. FIG. 6B shows a line B-B sectional view of the organic EL display panel of the present embodiment shown in FIG. 1B.

As shown in FIGS. 6A and 6B, the organic EL display panel of the present embodiment is the same as the organic EL display panel in Embodiment 1 except for the shape of hole transport layer 5 and the arrangements of first banks 9 and inorganic insulating film 22. Therefore, the same reference numerals are given to the same components as those of the organic EL display panel in Embodiment 1 and the description thereof will be omitted.

As shown in FIG. 6A, hole transport layer 5 is formed in lines in pixel regions 17 defined by first banks 9. Further, insulating film 22 is set on substrate 1 below hole transport layer 5. First banks 9 are set on insulating film 22.

Embodiment 5

In Embodiment 4, the organic EL display panel having no second banks was explained. In Embodiment 5, the organic EL display panel in which the hole transport layer is formed in lines and having second banks will be described. The organic EL display panel of the present embodiment is of passive matrix type.

The plan view of the organic EL display panel of the present embodiment is the same as that of Embodiment 2. Therefore, FIG. 3 is also a plan view of the organic EL display panel of the present embodiment.

Figure 7A:
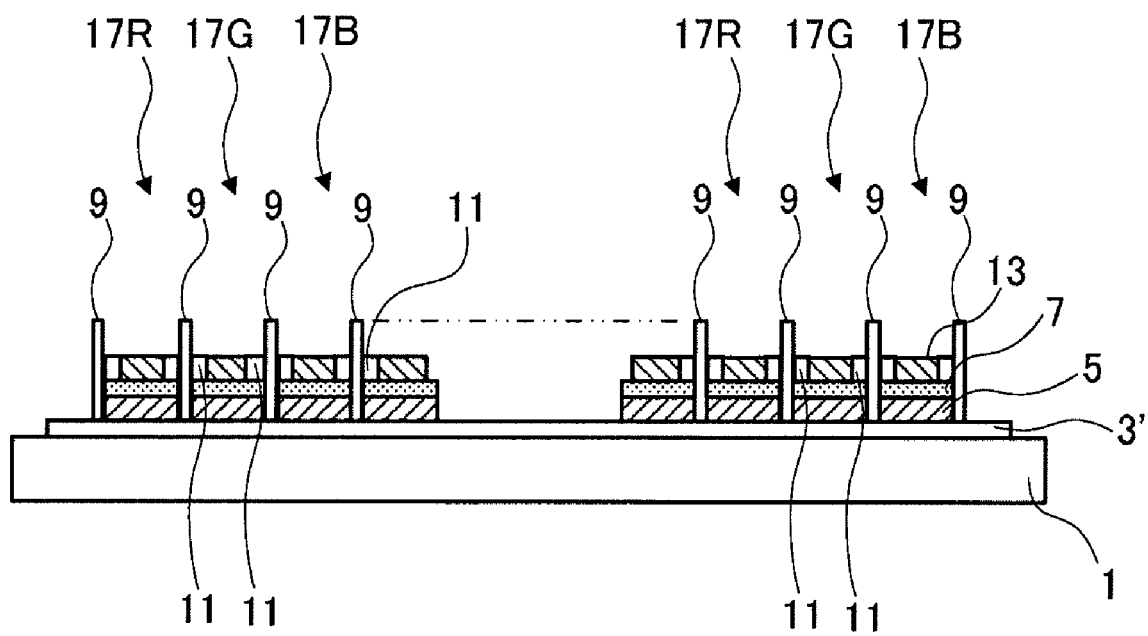
FIG. 7A is an A-A sectional view of the organic EL display panel shown in FIG. 3 in Embodiment 5.
Figure 7B:
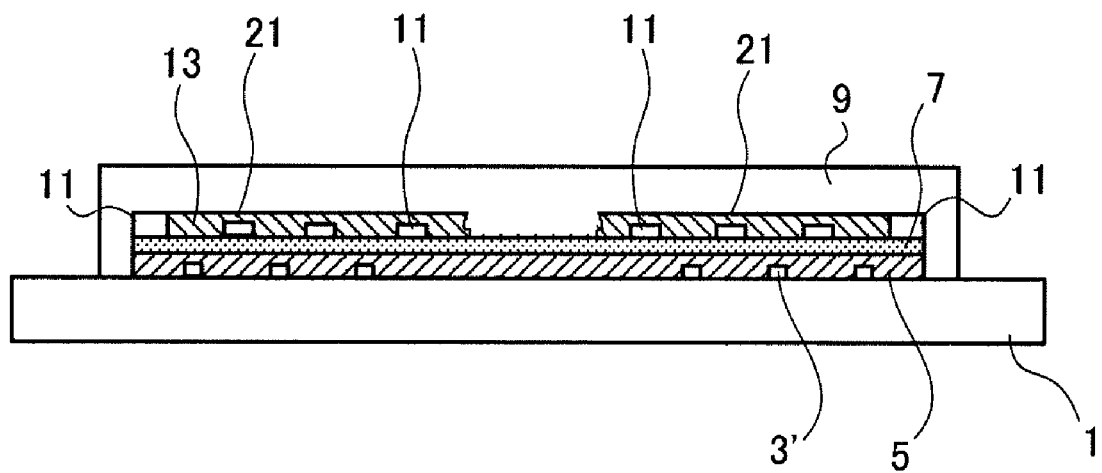
FIG. 7B is a B-B sectional view of the organic EL display panel shown in FIG. 3 in Embodiment 5.

FIG. 7A shows a line A-A sectional view of the organic EL display panel of the present embodiment shown in FIG. 3. FIG. 7B shows a line B-B sectional view of the organic EL display panel of the present embodiment shown in FIG. 3.

As shown in FIGS. 7A and 7B, the organic EL display panel of the present embodiment is the same as the organic EL display panel of Embodiment 4 except that it has anode electrodes 3' and second banks 11 and does not have insulating film 22. Therefore, the same reference numerals are given to the same members as those of the organic EL display panel in Embodiment 1 and the description thereof will be omitted.

As shown in FIGS. 7A and 7B, line-state anode electrodes 3' are set on substrate 1. Hole transport layer 5 is formed in lines on anode electrodes 3' in pixel regions 17. On interlayer 7, second banks 11 are set and define sub pixel regions. The top of first bank 9 is higher than the top of second bank 11, from substrate 1. The difference in the height is 1 μm or more and 10 μm or less, for example. In addition, second banks 11 preferably have some lyophilicity in view of their close contact with interlayer 7.

Polymer organic EL material 13 is patterned in sub pixel region 19 or patterned in pixel regions 17.

As shown in FIG. 7B, internal second banks 11 are set lower than those at the periphery (right and left ends in the figure). Internal second banks 11 correspond to grooves 21 (See FIG. 3). A layer of polymer organic EL material 13 is set so as to cover internal second banks 11 (grooves 21). That is, grooves 21 connect adjacent sub pixel regions 19 with each other. When a polymer ink containing polymer organic EL material is applied on pixel regions 17 defined by first banks 9, when sub pixel regions 19 are discrete without being connected with each other, it would be difficult to form polymer organic EL layer 13 uniformly in each sub pixel region 19. On the other hand, when grooves 21 are provided, since the polymer ink applied on pixel regions 17 flows between sub pixel regions 19, the thickness of polymer organic EL layer 13 is leveled out.

Embodiment 6

Figure 8:
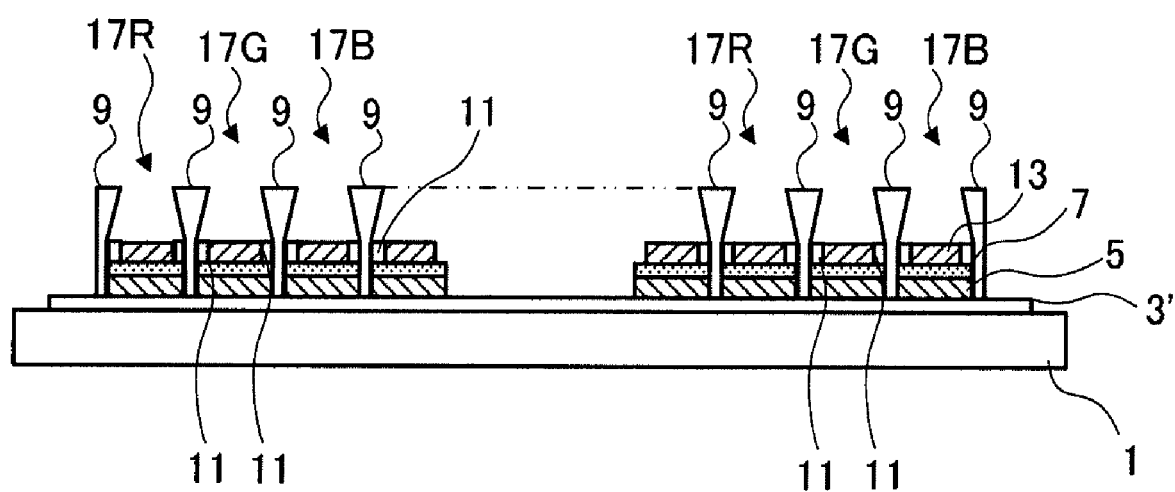
FIG. 8 is a sectional view of the organic EL display having a first bank in an inverted taper shape.

In FIG. 8, similarly to Embodiment 5, both hole transport layer 5 and interlayer 7 are formed in lines on each pixel region 17. The present embodiment is characterized in that first banks 9 defining pixel regions 17 have inverted taper shape. With this configuration, first banks 9 serve more effectively as a cathode separator, and mutual energization of respective cathode electrodes formed in organic EL layer 13 by a deposition method may be prevented more assuredly.

The present application claims priority based on Japanese Patent Application No. 2007-143906 filed on May 30, 2007. Contents described in the description of the application are all incorporated herein by reference.

INDUSTRIAL APPLICABILITY

The organic EL display panel of the present invention is made simply in the manufacturing process, in which the polymer organic EL layer included is formed by ink-jet or the like and hole transport layer and the like is formed by spin coating or the like. Further, since the thickness of the polymer organic EL layer is made uniform, light-emission characteristics are also improved. Therefore, a display panel with performance higher than that of conventional ones is manufactured efficiently.

EXPLANATION OF REFERENCE NUMERALS 1 substrate
3, 3' anode electrode
5 hole transport layer
7 interlayer
9 first bank
11 second bank
13 polymer organic EL layer
15 cathode electrode
17 pixel region
19 sub pixel region
21 groove
22 inorganic insulating film
23 contact hole

The invention claimed is:

1. An organic EL display panel comprising:
    a substrate;
    anode electrodes set on the substrate;
    a hole transport layer provided on the substrate provided with the anode electrodes;
    line-state first banks defining a line-state pixel region, the first banks being set on the hole transport layer;
    a line-state electron blocking layer set in the pixel region;
    a line-state polymer organic EL layer set on the electron blocking layer in the pixel region;
    a cathode electrode provided on the polymer organic EL layer; and
    second banks defining two or more sub pixel regions inside the pixel region, the second banks being set on the hole transport layer,
    wherein the second banks have a groove for connecting the adjacent sub pixel regions with each other.

2. The organic EL display panel according to claim 1, wherein
    the first banks contain a fluorine resin, or a surface of the first banks is fluorinated by fluorine gas plasma.

3. The organic EL display panel according to claim 1, further comprising an insulating inorganic film that protrudes from the first banks into the pixel region and is in contact with a bottom surface of the electron blocking layer or polymer organic EL layer,
    wherein a material of the hole transport layer contains tungsten oxide ($WO_x$), molybdenum oxide ($MoO_x$), vanadium oxide ($VO_x$) or a combination thereof.

4. The organic EL display panel according to claim 1, wherein the organic EL display panel is of active matrix type and the anode electrodes are arranged in matrix form on the substrate.

5. The organic EL display panel according to claim 1, wherein the polymer organic EL layer is formed by coating the pixel region with an ink containing a polymer organic EL material and a solvent by ink jet, dispensing, nozzle coating, intaglio printing or letterpress printing.

6. The organic EL display panel according to claim 1, wherein the electron blocking layer is formed by application of a solution containing a material of the electron blocking layer by spin coating, die coating or slit coating.

7. An organic EL display panel comprising:
    a substrate;
    anode electrodes set on the substrate;
    line-state first banks defining a line-state pixel region, the first banks being set on the substrate;
    a line-state hole transport layer set in the pixel region;
    a line-state electron blocking layer set in the pixel region;
    a line-state polymer organic EL layer set on the electron blocking layer in the pixel region;
    a cathode electrode provided on the polymer organic EL layer; and
    second banks defining two or more sub pixel regions inside the pixel region, the second banks being set on the hole transport layer,
    wherein the second banks have a groove for connecting the adjacent sub pixel regions with each other.

8. The organic EL display panel according to claim 7, wherein the first banks contain a fluorine resin, or a surface of the first banks is fluorinated by fluorine gas plasma.

9. The organic EL display panel according to claim 7, further comprising an insulating inorganic film that protrudes from the first banks into the pixel region and is in contact with a bottom surface of the electron blocking layer or polymer organic EL layer,
    wherein a material of the hole transport layer contains tungsten oxide ($WO_x$), molybdenum oxide ($MoO_x$), vanadium oxide ($VO_x$) or a combination thereof.

10. The organic EL display panel according to claim 7, further comprising an insulating inorganic film that protrudes from the first banks into the pixel region and is in contact with a bottom surface of the hole transport layer,
    wherein a material of the hole transport layer contains polyethylenedioxythiophene.

11. The organic EL display panel according to claim 7, wherein the organic EL display panel is of active matrix type and the anode electrodes arranged in matrix form on the substrate.

12. The organic EL display panel according to claim 7, wherein the polymer organic EL layer is formed by coating the pixel region with an ink containing a polymer organic EL material and a solvent by ink-jet, dispensing, nozzle coating, intaglio printing or letterpress printing.

13. The organic EL display panel according to claim 9, wherein the electron blocking layer is formed by application of a solution containing a material of the electron blocking layer by spin coating, die coating or slit coating.

14. The organic EL display panel according to claim 10, wherein the hole transport layer is formed by application of a solution containing a material of the hole transport layer by spin coating, die coating or slit coating.

* * * * *